United States Patent
Zojer

(10) Patent No.: US 9,559,683 B2
(45) Date of Patent: Jan. 31, 2017

(54) SYSTEM AND METHOD FOR A SWITCH HAVING A NORMALLY-ON TRANSISTOR AND A NORMALLY-OFF TRANSISTOR

(71) Applicant: Infineon Technologies Austria AG, Villach (AT)

(72) Inventor: Bernhard Zojer, Villach (AT)

(73) Assignee: Infineon Technologies Austria AG, Villach (AT)

( * ) Notice: Subject to any disclaimer, the term of this patent is extended or adjusted under 35 U.S.C. 154(b) by 144 days.

(21) Appl. No.: 14/473,207

(22) Filed: Aug. 29, 2014

(65) Prior Publication Data

US 2016/0065064 A1 Mar. 3, 2016

(51) Int. Cl.
- *H02M 3/158* (2006.01)
- *H03K 17/10* (2006.01)
- *H02M 7/219* (2006.01)
- *H03K 17/687* (2006.01)

(52) U.S. Cl.
CPC .......... *H03K 17/107* (2013.01); *H02M 7/219* (2013.01); *H03K 17/6871* (2013.01); *H03K 2017/6875* (2013.01); *H03K 2217/0036* (2013.01)

(58) Field of Classification Search
CPC .......... H02M 1/36; H02M 1/08; H02M 3/156; H02M 7/219; G05F 1/10; H03K 17/107; H03K 17/6871; H03K 2017/6875; H03K 2217/0036; H01L 27/0251; H03F 1/0261; H03F 1/223; H03F 1/3205; H03F 1/52; H03F 1/523; H03F 2200/27; H03F 2200/451; H03F 2200/471; H03F 3/19; H03F 3/193; H03F 3/245

USPC .................................................. 323/284, 285
See application file for complete search history.

(56) References Cited

U.S. PATENT DOCUMENTS

| | | | |
|---|---|---|---|
| 4,437,096 | A | 3/1984 | Brightman et al. |
| 4,992,924 | A | 2/1991 | Gousset et al. |
| 5,285,369 | A | 2/1994 | Balakrishnan |
| 5,705,950 | A | 1/1998 | Butler |
| 5,892,389 | A | 4/1999 | Lai |
| 7,245,175 | B2 | 7/2007 | Morita |
| 7,408,399 | B2 | 8/2008 | Salato et al. |
| 7,557,637 | B2 | 7/2009 | Sakamoto |
| 7,777,553 | B2 | 8/2010 | Friedrichs |
| 8,228,113 | B2 | 7/2012 | Domes |
| 8,228,114 | B1 * | 7/2012 | Cilio .............. H03K 17/567 327/430 |

(Continued)

FOREIGN PATENT DOCUMENTS

DE 102010027832 B3 7/2011

*Primary Examiner* — Jessica Han
*Assistant Examiner* — Demetries A Gibson
(74) *Attorney, Agent, or Firm* — Slater Matsil, LLP

(57) ABSTRACT

In accordance with an embodiment, a circuit includes a first driver having a first output configured to be coupled to a control node of a normally-off transistor. The first driver is configured to drive a first switching signal at the first output in a cascode mode and configured to drive a first constant voltage at the first output in a direct drive mode. The circuit further includes a second driver having a second output configured to be coupled to a control node of a normally-on transistor that has a second load path terminal coupled to a first load path terminal of the normally-off transistor. The second driver is configured to drive a second switching signal at the second output in the direct drive mode.

21 Claims, 8 Drawing Sheets

(56) References Cited

U.S. PATENT DOCUMENTS

| | | |
|---|---|---|
| 8,487,667 B2 | 7/2013 | Iwamura |
| 9,083,343 B1* | 7/2015 | Li .................... H03K 17/063 |
| 9,172,339 B2* | 10/2015 | Binet .................... H03F 3/2171 |
| 2009/0009232 A1 | 1/2009 | Helfrich et al. |
| 2009/0160496 A1 | 6/2009 | Takeuchi |
| 2009/0251217 A1 | 10/2009 | Keerti |
| 2010/0109781 A1 | 5/2010 | Deguchi et al. |
| 2011/0025422 A1 | 2/2011 | Marra et al. |
| 2012/0133397 A1* | 5/2012 | Draxelmayr ............ H02M 1/08 327/81 |
| 2012/0133420 A1 | 5/2012 | Draxelmayr et al. |
| 2013/0009674 A1 | 1/2013 | Reese et al. |
| 2014/0002049 A1* | 1/2014 | Schrom .................. H02M 1/08 323/311 |
| 2014/0049296 A1 | 2/2014 | Jeon et al. |
| 2014/0078781 A1* | 3/2014 | Imada .................... H02M 3/24 363/15 |
| 2014/0146428 A1 | 5/2014 | Pansier |
| 2014/0218112 A1* | 8/2014 | Brantley ............ H03F 3/45192 330/254 |
| 2014/0300421 A1* | 10/2014 | Knopik ............... H01L 27/0251 330/296 |
| 2015/0137619 A1 | 5/2015 | Seeman et al. |
| 2015/0318851 A1 | 11/2015 | Roberts et al. |

* cited by examiner

SYSTEM AND METHOD FOR A SWITCH HAVING A NORMALLY-ON TRANSISTOR AND A NORMALLY-OFF TRANSISTOR

CROSS-REFERENCE TO RELATED APPLICATIONS

This application relates to the following co-pending and commonly assigned patent applications: Ser. No. 14/473,101, filed Aug. 29, 2014, which application is incorporated herein by reference in its entirety.

TECHNICAL FIELD

The present disclosure relates generally to an electronic device, and more particularly to a system and method for a switch having a normally-on transistor and a normally-off transistor.

BACKGROUND

Power supply systems are pervasive in many electronic applications from computers to automobiles. Generally, voltages within a power supply system are generated by performing a DC-DC, DC-AC, and/or AC-DC conversion by operating a switch loaded with an inductor or transformer. One class of such systems includes switched mode power supplies (SMPS). An SMPS is usually more efficient than other types of power conversion systems because power conversion is performed by controlled charging and discharging of the inductor or transformer which reduces energy lost due to power dissipation caused by resistive voltage drops.

Specific topologies for SMPS comprise buck-boost converters and flyback converters, among others. A buck-boost converter typically makes use of an inductor whereas a flyback converter isolates a load and may multiply the voltage conversion ratio through the use of a transformer. In addition to the energy storage element (either inductor or transformer), the operation of the switch is of particular importance, especially in high voltage applications.

SUMMARY OF THE INVENTION

In accordance with an embodiment, a circuit includes a first driver having a first output configured to be coupled to a control node of a normally-off transistor. The first driver is configured to drive a first switching signal at the first output in a cascode mode and configured to drive a first constant voltage at the first output in a direct drive mode. The circuit further includes a second driver having a second output configured to be coupled to a control node of a normally-on transistor that has a second load path terminal coupled to a first load path terminal of the normally-off transistor. The second driver is configured to drive a second switching signal at the second output in the direct drive mode.

BRIEF DESCRIPTION OF THE DRAWINGS

For a more complete understanding of the present invention, and the advantages thereof, reference is now made to the following descriptions taken in conjunction with the accompanying drawings, in which.

Figure 1A:
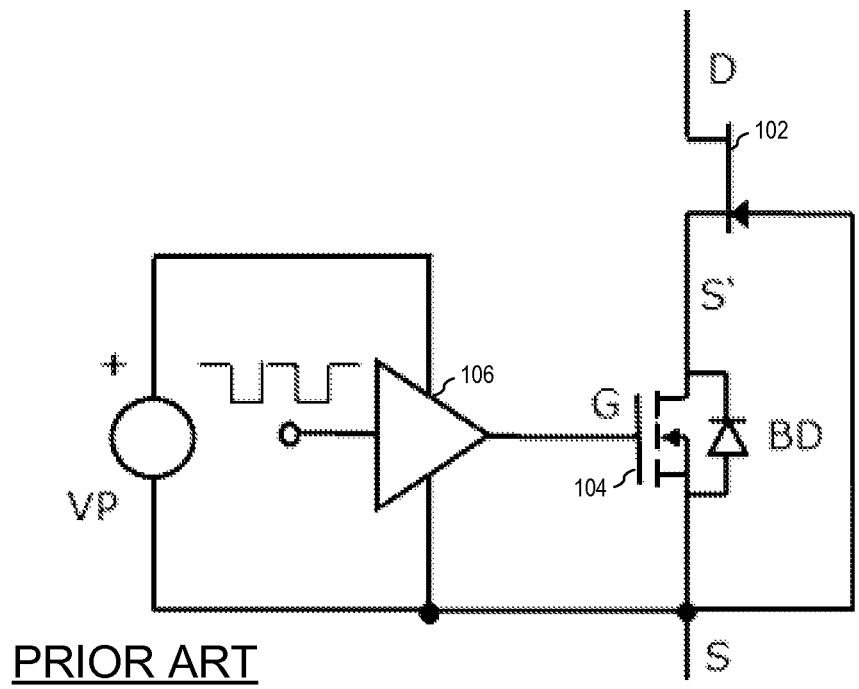
FIGS. 1a-1b illustrate conventional compound switching circuits.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a system and method for a switch having a normally-on transistor coupled in series with a normally-off transistor. Embodiments of the present invention may also be applied to various systems that utilize such a circuit structure, for example, switched-mode power supplies.

In an embodiment of the present invention, a switch controller for driving a compound switch having a normally-on transistor in series with a normally-off transistor includes a first driver circuit configured to drive the gate of a normally-off transistor, such as an enhancement mode MOSFET, as well as a second driver circuit configured to drive the gate of a normally-on transistor, such as a JFET or a gallium nitride (GaN) HEMT. In one mode of operation, the first driver circuit provides a bias voltage that turns on the normally-off device and the second driver provides a series of pulses that turns the normally-on device on and off. In this mode of operation, the second driver circuit effectively directly drives the normally-on device. In another mode of operation, the normally-on device operates as a cascode device, and the series of pulses is supplied to the gate of the normally-off device via the first driver circuit. In one example, the normally-on device is biased as a cascode device by coupling the gate of the normally-on device to the source of the normally-off device and by placing the output of the second driver circuit in a high impedance state.

In some embodiments, the controller includes a switch coupled between the gate of the normally-on device and the source of the normally-off device. When the compound switch is operated as a cascode device, the switch is closed in order to couple the gate of the normally-on device to the source of the normally-off device. On the other hand, when the compound switch is operated as a directly driven device, the switch is open in order to allow the second driver circuit to drive the gate of the normally-on device.

Certain types of power transistors, such as the junction field effect transistor (JFETs) and gallium nitride (GaN) high electron mobility transistor (HEMT) behave as "normally-on" devices in that they are in a conductive state when zero volts is applied between the gate and source of the transistor. In order to switch these transistors off, a sufficiently high negative gate voltage is applied between the gate and the source of the transistor. For example, in the case of a GaN HEMT, this reverse voltage may be between about −5 V and about −8 V; however, turn off voltages outside of this range may also occur in some devices. Accordingly, in some systems, such as those that utilize charge pumps to develop negative bias voltages, there is a risk that the normally-on device may cause a short circuit between the power supply rails of the device before the charge pump has sufficient time to produce a sufficiently high negative voltage to turn off the normally-on device. Moreover, there is also a risk of short circuits during various fault conditions.

One way in which this issue has been dealt with is by coupling the normally-on device in series with a normally-off device such as an enhancement mode MOSFET device in a cascode configuration, as illustrated in FIG. 1a. As shown, the source of the normally-on device 102 is coupled to the drain of the normally-off device 104 at node S', and the gate G of the normally-off device 104 is driven by driver circuit 106.

Here, the gate G of the normally-off device 104 acts as the control terminal that is driven by driver circuit 106, whereas the gate of normally-on device 102 is connected to the source S of normally-off device 104. During startup, the series combination of the normally-on device and the normally-off device is non-conductive. Once the requisite supply voltage becomes available, the normally-off device may be driven with an input signal, such that the normally-on device functions as a cascode device. If the current flow through the switch is forced in the reverse direction, the body diode BD of the normally-off device 104 becomes forward biased. Due to the circuit topology (i.e. connecting the source node S' of normally-on transistor 102 with the source node S of normally-off transistor 104), the normally-on device remains in its on-state, i.e. VGD>0.

There are, however, a number of issues with the composite device when operated as a cascode. First, switching losses may occur because the gate-source capacitance of normally-on device 102 is driven by the high power supply and not by the low gate driver supply voltage. Furthermore, additional switching losses may occur because of the drain capacitance of normally-off device 104, which may be a very large device in order to handle high currents and have a low impedance. As the parasitic drain capacitance of normally-off device 104 is being charged and discharged during operation, power is lost.

Another issue with the cascode configuration is that there is a potential for voltage stress on normally-off device 104. For example, during operation, the voltage at node S' may have large voltage transients due to capacitive coupling from the drain of normally-on device 102. In other words, the voltage at node S goes beyond the negative threshold of normally-on device 102, and may reach 20 V and above in some fast switching conditions.

Figure 1B:
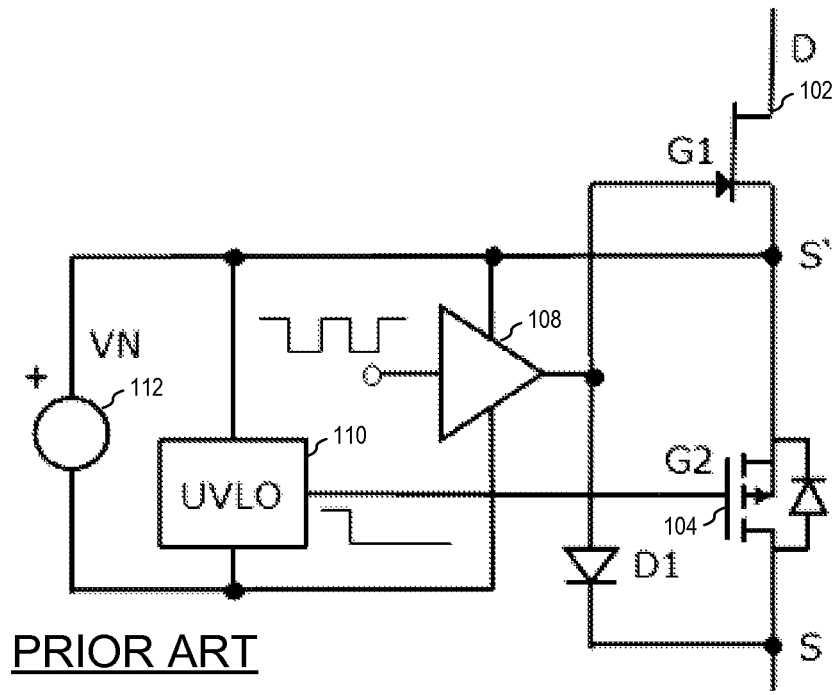

FIG. 1b illustrates another manner in which compound device including a normally-on transistor and a normally-off transistor may be operated. Here the gate G1 of normally-on device 102 is directly driven using driver 108 and gate G2 of normally-off device 104 is turned on according to the output of under voltage lockout block 110, which turns on normally-off device 104 after power supply 112 has reached a voltage sufficient to turn off normally-on device 102. During normal operation, normally-off device 104 remains in an on state. During startup and failure conditions, normally-off device 104 may be shut off, and diode D1 prevents the drain voltage of the normally-off device from reaching high voltages by clamping the gate G1 of normally-on device 102 to the source voltage of normally-off device 104. In such a directly driven configuration, however, dedicated drivers may be needed to drive both gates G1 and G2 of normally-on device 102 and normally-off device 104. Another issue with the directly driven approach is that a high reverse current across the series connected devices results in a high voltage drop across normally-on device 102.

Figure 2A:
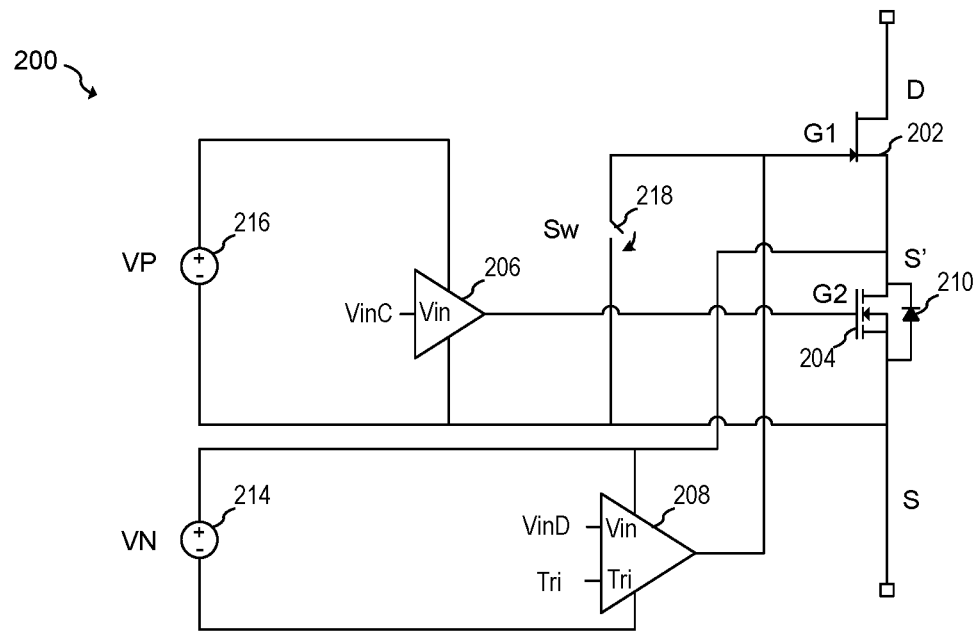
FIGS. 2a-2c illustrate switching circuits according to an embodiment of the present invention.

In an embodiment according to the present invention, a normally-on device and coupled in series with a normally-off device are selectively configurable to be driven either as a cascode device, in which the normally-off device is switched on and off according to an input signal with the normally-on device acting as a cascode transistor, or as a directly driven device, in which the normally-on device is switched on and off according to the input signal with the normally-off device turned on during directly driven operation. Such an embodiment is illustrated in FIG. 2a that illustrates embodiment compound switch and driver system 200 including normally-on device 202 coupled in series with normally-off device 204. The body diode of normally-off device 204 is represented by diode 210. As shown, normally-off device 204 is driven by driver circuit 206 and normally-on device 202 is driven with tri-state driver circuit 208. Switch 218 is configured to selectively couple gate G1 of normally-on device 202 to the source S of normally-off device 204.

Driver circuit 206 receives its power from power supply 216. Accordingly, the output voltage of driver circuit 206 may switch between the source voltage of normally-off device 204 at node S and a voltage that is the sum of the source voltage of normally-off device 204 and the voltage of power supply 216. In some embodiments, the voltage VP of power supply 216 is sufficient to turn on normally-off device 204, but is made low enough to avoid overstressing the gate of normally-off device 204. For example, the voltage VP may range, between about 5 V and about 12 V, however, in other embodiments, voltages outside of this range may also be used.

Driver circuit 206 may be implemented using driver circuits known in the art. For example, a Texas Instruments UCC 275x may be used to implement driver circuit 206 in some embodiments. Power supply 216 may be implemented using DC power supply systems and methods known in the art. For example, power supply 216 may be implemented using the secondary or auxiliary winding of a transformer in a switched mode power supply along with a diode and/or synchronous rectifier. In some embodiments, voltage VP may be further regulated using, for example, a linear voltage regulator. Alternatively, other known power supply schemes may be used.

Tri-state driver circuit 208 receives its power from power supply VN having a positive terminal connected to source node S' of normally-on device 202. Accordingly, the output voltage of tri-state driver circuit 208 may switch between the voltage at the negative terminal of power supply 214 and the voltage at the positive terminal of power supply 214 for a voltage range of VN. In some embodiments, the voltage VN of power supply 214 is sufficient to provide an adequate negative turn-off voltage to gate G1 of normally-on device 202 to provide margin under various operating conditions. In one embodiment, voltage VN is between about −10 V and about −15 V for normally-off devices having a threshold of between about −5 V and about −8 V. However, voltages outside of this range depend on the particular embodiment and the type of device being used. For example, the threshold of a GaN HEMT device may vary considerable over temperature and operating conditions because of its sensitivity to temperature and drift effects.

In an embodiment, tri-state driver circuit 208 operates as a driver circuit when a logic LOW is asserted at pin Tri, and has a high impedance output when a logic HIGH is asserted at pin Tri. Alternatively, the logic control signals at pin Tri may be inverted. For example, tri-state driver circuit 208 may operate as a driver circuit when a logic LOW is asserted at pin Tri, and may have a high impedance output when a logic HIGH is asserted at pin Tri. According to various embodiments, tri-state driver circuit 208 may be implemented using tri-state driver circuits known in the art. For example, the IXYS 609 low side MOSFET driver by IXYS may be used to implement tri-state driver circuit 208. Similar to power supply 216, power supply 214 may also be implemented using DC power supply systems and methods known in the art. For example, power supply 214 may be implemented using the secondary or auxiliary winding of a transformer in a switched mode power supply along with a diode and/or synchronous rectifier. In some embodiments, voltage VN may be further regulated using, for example, a linear voltage regulator. Alternatively, other known power supply schemes may be used.

Figure 2B:
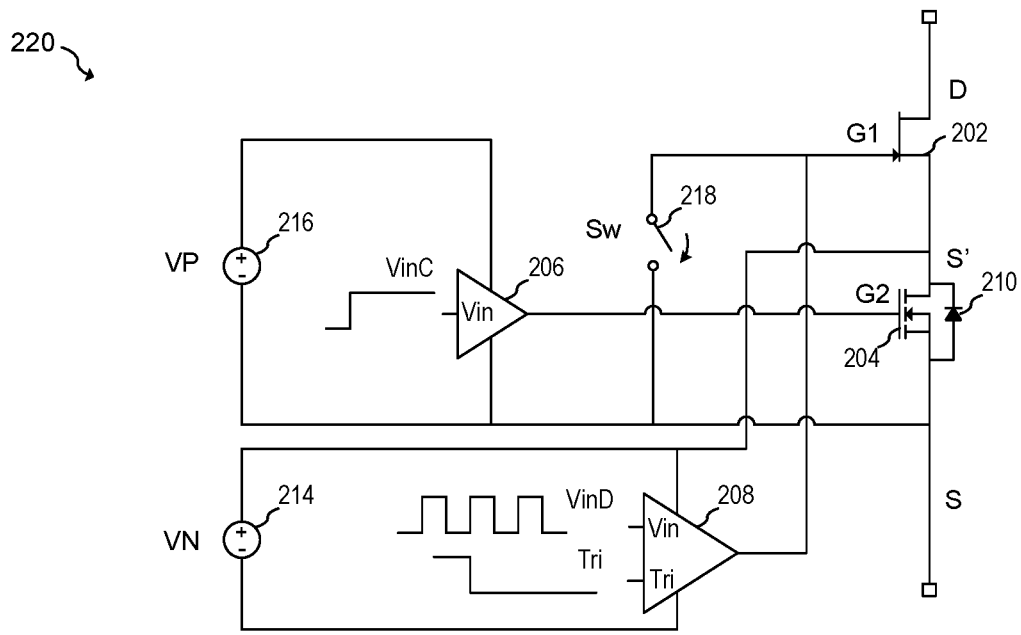
Figure 2C:
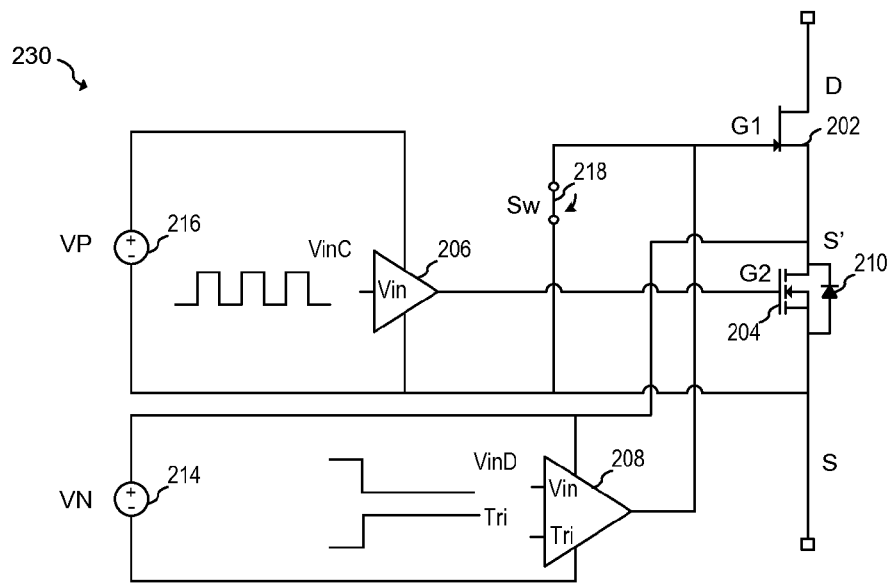

In an embodiment, the operational mode of compound switch and driver system 200 is determined by the state of switch 218, whether or not tri-state circuit 208 has a high output impedance, and which driver circuit 206 or 208 supplies the switching signal. FIG. 2b illustrates the operation of the compound switch and driver system in the directly driven mode and FIG. 2c illustrates the operation of the compound switch and driver system in the cascode mode.

In an embodiment compound switch and driver system 220 is operated in a directly driven mode by opening switch 218, supplying a turn-on voltage to normally-on device 204 via driver circuit 206 and supplying a switching signal to normally-on device 202 via tri-state driver circuit 208. In some embodiments, the turn-on voltage is supplied to normally-off device 204 by supplying a logic HIGH to driver circuit 206 at input node VinC. The switching signal is supplied to normally-off device 202 by supplying a switching signal to input VinD of tri-state driver circuit 208 and a logic low to the tri-state mode input pin Tri of tri-state driver circuit 208. During operation, switch 218 is opened to prevent the output of tri-state driver circuit 208 from being short-circuited with source node S of normally-off device 204.

In an embodiment compound switch and driver system 230 is operated in a cascode mode by closing switch 218, supplying a switching signal to normally-on device 204 via driver circuit 206, coupling gate G1 of normally-on device 202 to source node S of normally-off device 204. The output of tri-state driver circuit 208 is set to be a high-impedance to avoid shifting the bias of source node S of normally-off device 204. In some embodiments, tri-state driver circuit 208 is placed in the tri-state mode by supplying a logic LOW to tri-state mode input pin Tri of tri-state driver circuit 208, and the switching signal is supplied to driver circuit 206 via input pin VinC.

Figure 3:
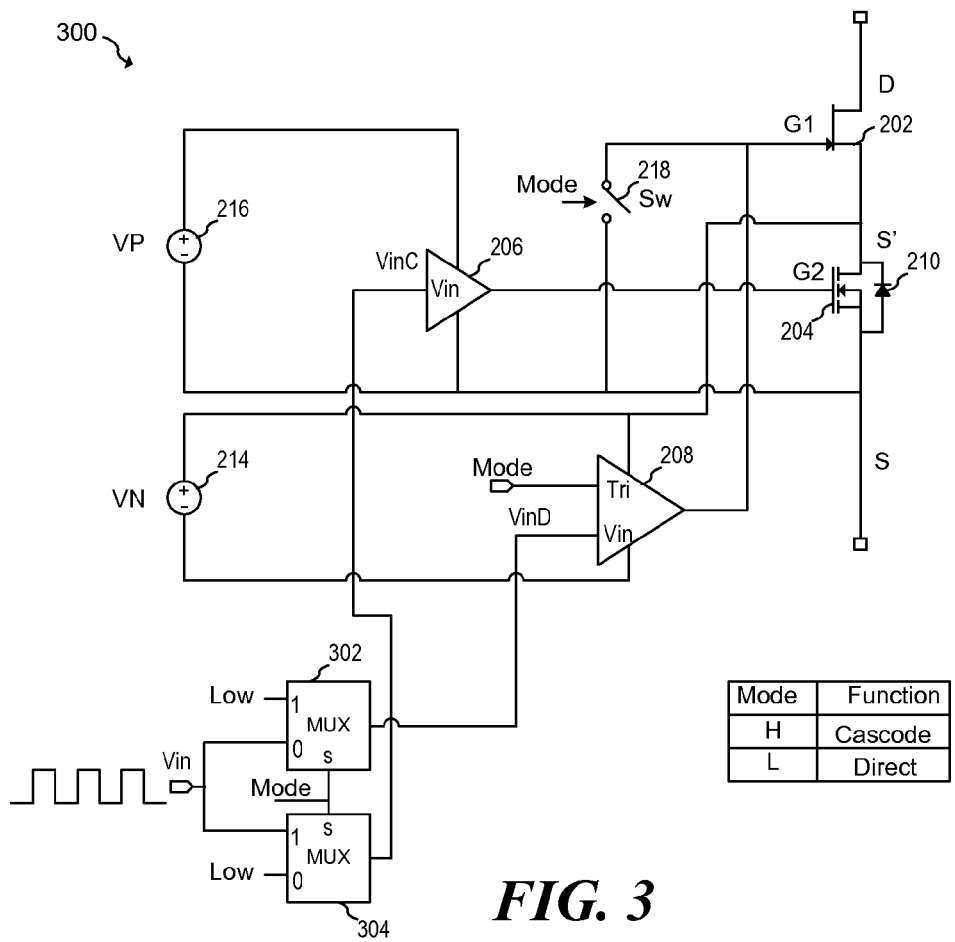
FIG. 3 illustrates a compound switching circuit according to another embodiment.

FIG. 3 illustrates embodiment compound switch and driver system 300 according to another embodiment that includes additional mode control circuitry. As shown, input signal Mode controls the mode of compound switch and driver system 300 such that when a logic HIGH is applied to the Mode input, the system operates in a cascode mode and when a logic LOW is applied to the Mode input, the system operates in a directly driven mode. As illustrated, Mode input signal is applied to switch 218, tri-state input pin Tri and multiplexers 302 and 304. Thus, when a logic HIGH is applied to the Mode input signal, switch 218 is closed and the output of tri-state driver circuit 208 is set to a high impedance, thereby coupling source node S of normally-off device 204 to gate G1 of normally-on device 202. The mode input signal also routes input switching signal Vin to input VinC of driver circuit 206 via multiplexer 304 and a logic LOW signal to input VinD of tri-state driver circuit 208 via multiplexer 302, thereby routing the input switching signal to driver circuit 206. In some embodiments, a logic HIGH signal may be provided to input VinD of tri-state driver circuit 208, since tri-state driver circuit 208 operates in a high impedance output mode.

On the other hand, when a logic LOW is applied to the Mode input signal, switch 218 is opened and tri-state driver circuit 208 is configured to drive gate G1 of normally-on device 202, thereby driving normally-on device 202 directly. The mode input signal also routes input switching signal Vin to input VinD of tri-state driver circuit 208 via multiplexer 302 and a logic HIGH signal to input VinC of driver circuit 206 via multiplexer 304, thereby routing the input switching signal to driver circuit 208 and turning on normally-off device 204.

It should be appreciated that the compound switch and driver system 300 shown in FIG. 3 is just one specific embodiment example of a compound switch and driver system. In alternative embodiments, other functionally similar circuits and topologies may be used. For example, in some embodiments, the polarity of the Mode input signal may be inverted such that a HIGH Mode input signal selects the directly driven mode and a LOW Mode input signal selects the cascode mode. In some embodiments, multi-bit selection logic may be used.

Figure 4A:
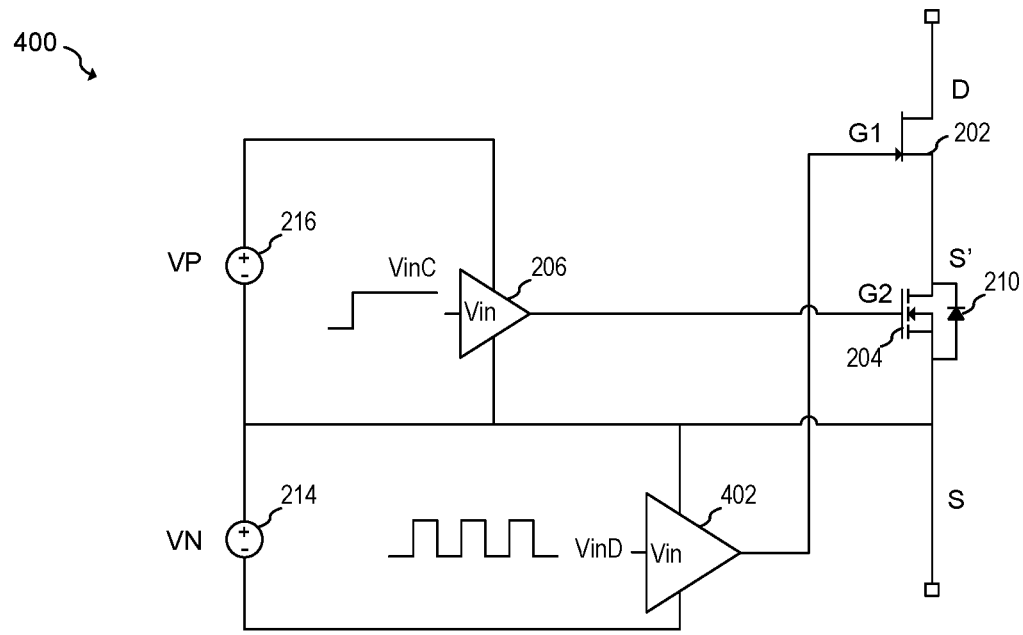
FIGS. 4a-4c illustrate compound switching circuits according to a further embodiment.
Figure 4B:
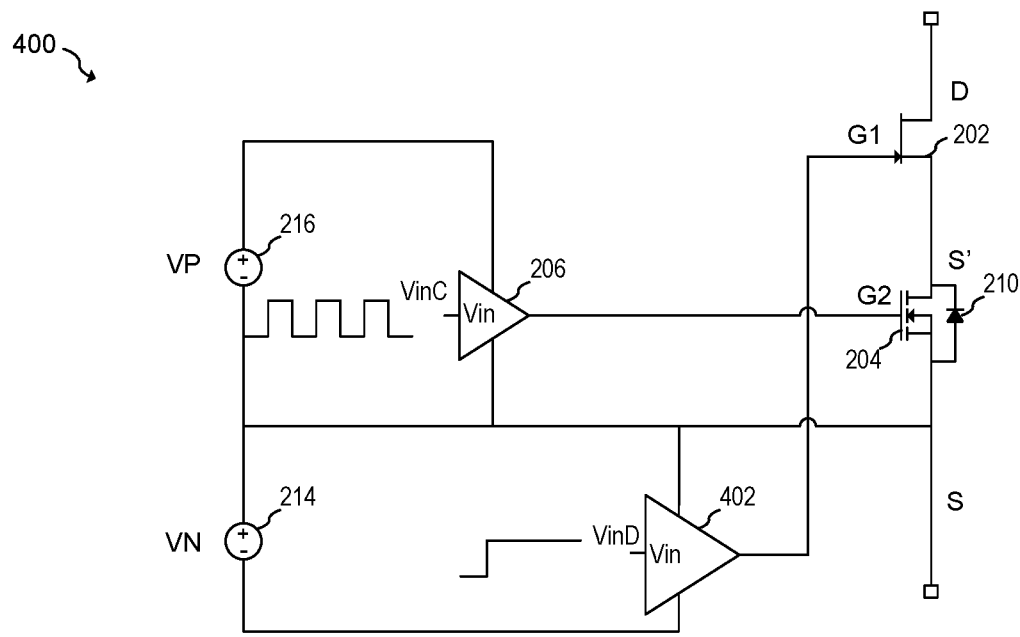
Figure 4C:
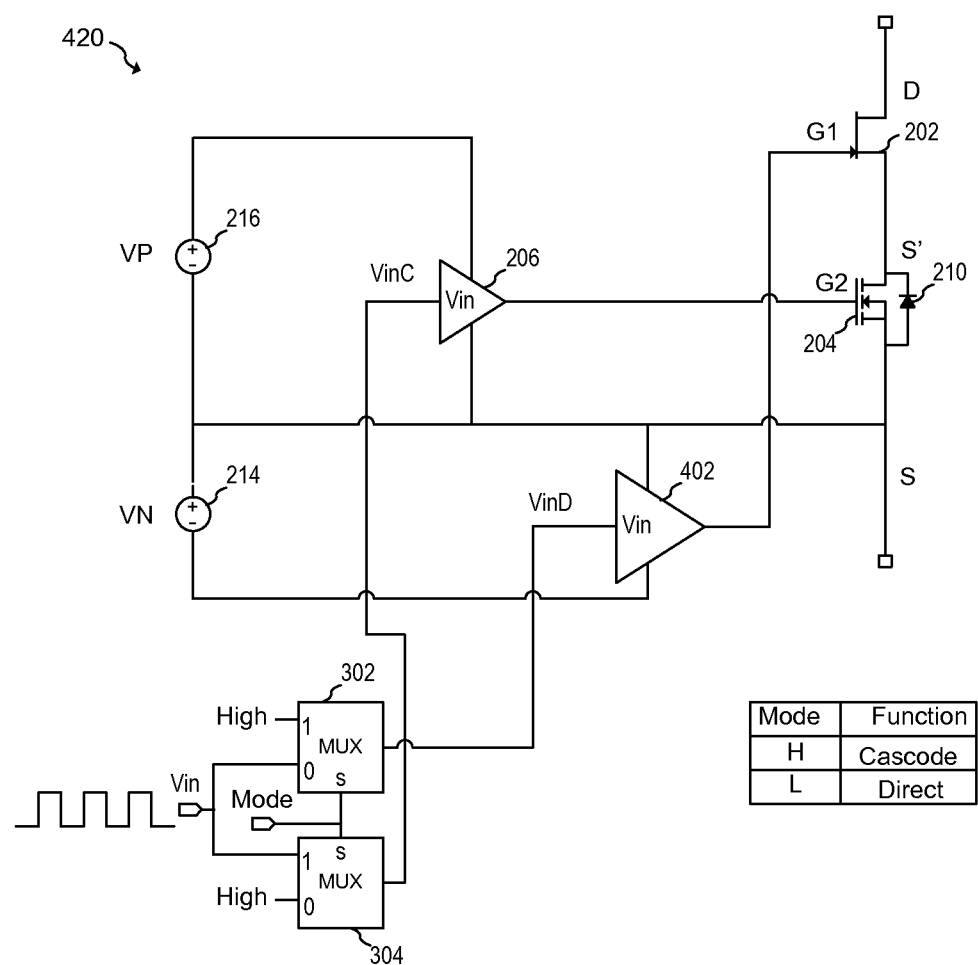

FIGS. 4a-c illustrate compound switch and driver systems according to a further embodiment of the present invention. Here, instead of using a switch and a tri-state driver circuit to configure the connection to normally-on device 202, mode switching between the directly driven mode of operation and the cascode mode of operation is enabled by selectively, driving the amplifiers coupled to the gates of normally-on device 202 and normally-off device 204.

FIG. 4a illustrates driver system 400 configured to operate in a direct drive mode. As shown, driver system 400 includes driver circuit 206 having an output coupled to gate connection G2 of normally-off device 204 and driver circuit 402 having an output coupled to gate connection G1 of normally-on device 202. The positive supply of power supply 214, the negative supply of power supply 216, the negative supply of driver circuit 206 and the positive supply of driver circuit 402 are coupled to source S of normally-off device 204.

During the direct drive mode of operation, gate connection G2 of normally-off device 210 is biased, for example, to the positive voltage VP of power supply 216 via driver circuit 206, thereby turning on normally-off device 204. In an embodiment, normally-off device 204 may be turned on by applying a logic high at input VinC of driver circuit 206. A switching signal is then applied to input VinD of driver circuit 402. In an embodiment, the output of driver circuit 402 switches input G1 at the gate of normally-on device 202 between the voltage at source node S of normally-off device 204 and the voltage at the negative terminal of power supply 214. When the gate node G1 of normally-on device 202 is biased at negative supply voltage of gate driver 402, normally-on device 202 is shut off. When the gate node 202 is biased at the source voltage S of normally-off device 204 (positive supply of gate driver), normally-on device 202 is turned on. In an embodiment, voltages VP and VN of power supplies 216 and 214 are set according to the threshold voltages of normally-off device 204 and normally-on device 202 respectively. In one example, for driver system 400, the voltage VP of power supply 216 is between about 5 V and about 12 V; and the voltage VN of power supply 402 is between about 10 V and about 15 V. In alternative embodiments, different voltages may be used.

FIG. 4b illustrates driver system 400 configured to operate in a cascode mode. Here, input VinD of driver circuit 402 is set to a logic high in order to apply the voltage of source node S of normally-off device 204 to gate G1 of normally-on device 202. A switching voltage is applied to input VinC of driver circuit 206, which, in turn, applies the switching signal to gate connection G2 of normally-off device 204.

FIG. 4c illustrates embodiment compound switch and driver system 420 according to further embodiment that includes additional mode control circuitry. In this case, a switching signal is applied to the inputs of multiplexers 302 and 304, which selectively route the switching signal to gate connection G1 of normally-on device 202 in direct drive mode and to gate connection G2 of normally-off device 204 in cascode mode.

In an embodiment, when the Mode input is high, embodiment compound switch and driver system 420 operates in the Cascode mode. Here, when the Mode input is high, multiplexer 302 selects a logic high input and applies the logic high input to input VinD of driver circuit 402, thereby turning on normally-on device 202. Multiplexer 302 applies the switching signal to input VinC of driver circuit 206, which, in turn, applies the switching signal to normally-off device 204.

When the mode input is low, embodiment compound switch and driver system 420 operates in the direct drive mode. Here, when the Mode input is low, multiplexer 302 selects the switching signal and applies the switching signal to input VinD of driver circuit 402, thereby applying the switching signal to normally-on device 202. Multiplexer 304 applies a logic high signal to input VinC of driver circuit 206, which, in turn, turns on normally-off device 204. It should be understood compound switch and driver system 420 shown in FIG. 4c is just one specific embodiment example of a compound switch and driver system. In alternative embodiments, other functionally similar circuits and topologies may be used.

Figure 5:
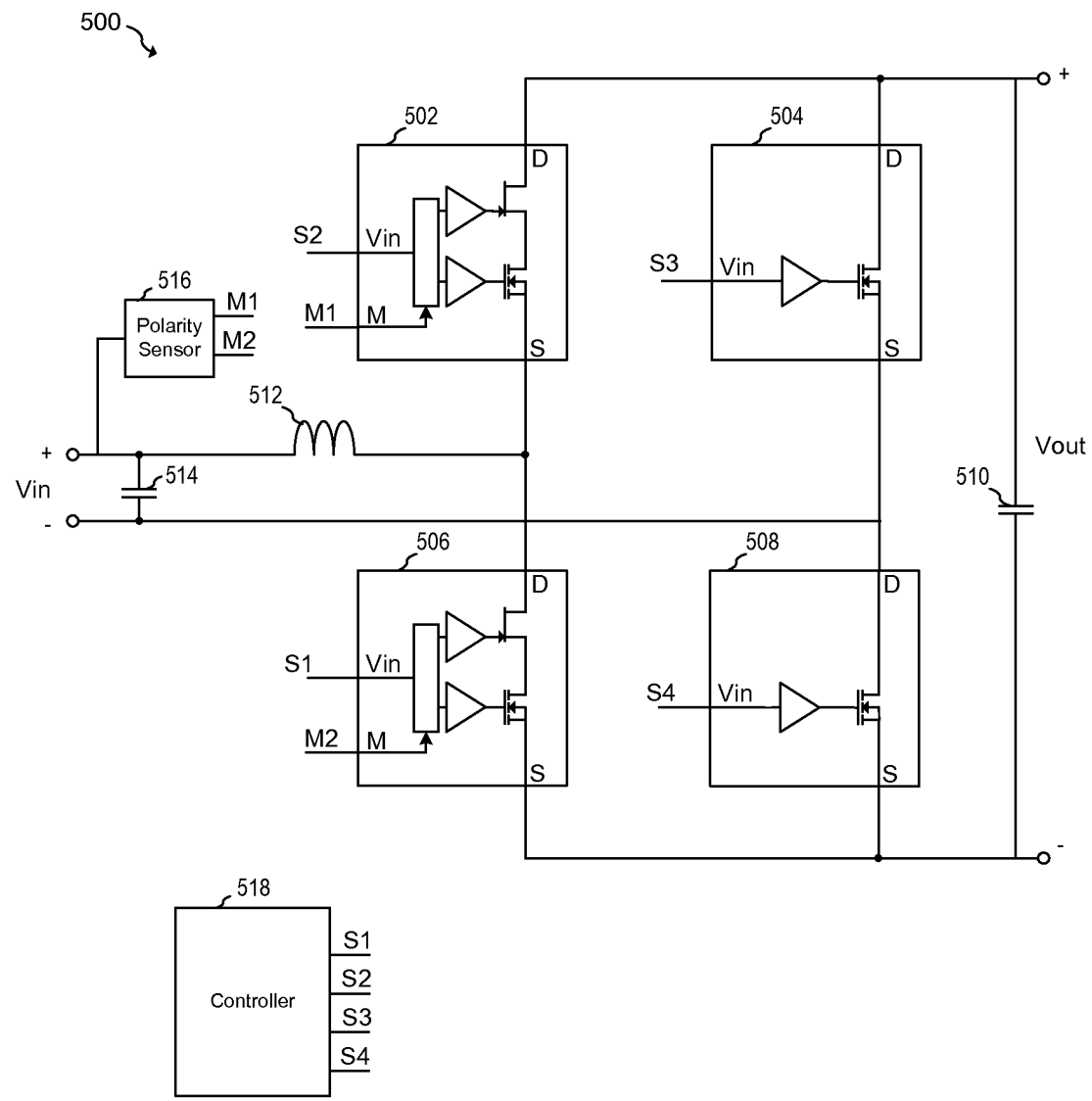
FIG. 5 illustrates an embodiment switched-mode power supply circuit that utilizes embodiment composite switching circuits.

FIG. 5 illustrates switched-mode power converter 500 according to an embodiment of the present invention that is configured to convert an AC input signal, such as a 50 Hz to 60 Hz line voltage at input port Vin to a DC output voltage at output port Vout. For example, in one embodiment, switched-mode power converter 400 is configured to convert a 120 VAC or 240 VAC input 50 Hz to 60 Hz power line input voltage to a DC output voltage of about 400 V. Alternatively, other input and voltages operated at the same or different frequency ranges may be used.

Switched-mode power converter 500 includes an H-bridge implemented using embodiment compound switch and drivers 502 and 506 according to embodiments described herein. This H-bridge is coupled to input port Vin via inductor 512. During operation of switched-mode power converter 500, compound switch and drivers 502 and 506 magnetize and demagnetize inductor 512 such that power is transferred from input port Vin to output port Vout. Switching circuits 504 and 508 that include MOSFET switching transistors are operated as synchronous rectifiers that provide a return current path and may also be implemented using diodes in some embodiments. Capacitor 514 represents the input capacitance of switched-mode power converter 500 and capacitor 510 represents the load capacitance of switched-mode power converter 500. Each embodiment compound switch and driver 502 and 506 includes a normally-on device coupled in series with a normally-off device and is configured to receive a switching signal at input pin Vin and a mode select signal at input pin M. In an embodiment, controller 518 provides switching signals to embodiment compound switch and drivers 502 and 506 and to switching circuits 504 and 508, the timing of which are configured to convert an AC input signal at input port Vin to a DC output signal at port Vout. Controller 518 may be implemented using an H-bridge-based switched mode power controller known in the art. In some embodiments controller 518 may utilize current and/or voltage feedback from various nodes and current branches of switched-mode power converter 500 in order to provide feedback control of the output voltage, output current, and/or input currents. For example, the switching of signals S1, S2 coupled to compound switch and drivers 506 and 502 and signals S3 and S4 coupled to switching circuits 504 and 508 may be configured to provide a controlled output voltage and a controlled input current such that power factor correction is achieved.

In an embodiment, each of embodiment compound switch and drivers 502 and 506 are configured to operate in a cascode mode when a logic HIGH is asserted at input pin M and operates in a directly driven mode when a logic LOW is asserted at input pin M. In alternative embodiments, the polarity of the mode select signal may be reversed. Polarity sensor 516 is configured to sense the polarity of input line voltage Vin and produce mode signals M1 and M2 according to the sensed line voltage.

In an embodiment, the operating modes for embodiment compound switch and drivers 502 and 506 are selected such that switching losses are reduced and high voltage reverse bias conditions across the normally-on devices are avoided. For example, when the voltage at input port Vin has a positive polarity, compound switch and driver 506 coupled to control signals S1 essentially functions as switch and compound switch and driver 502 coupled to control signals S2 essentially functions as diode. Accordingly, when the voltage at input port Vin has a positive polarity, compound switch and driver 502 can be configured as cascode device and compound switch and driver 506 can be configured as directly driven device. By operating compound switch and driver 502 as cascode device when they function as diode, a large reverse voltage across the normally-on device can be avoided. Although switching losses are slightly higher, the total losses can be reduced in certain applications (particularly at high switching frequency at medium voltage). In other applications and under different conditions, any of the other possible combinations (switch operated in cascode mode, diode directly driven or both in cascode mode or both directly driven) may be used depending on the particular system and its specifications.

When Vin changes polarity, devices 502 and 506 change their function. Now 502 acts as a switch, whereas 506 acts as a diode. The assigned modes to embodiment compound switch and drivers 502, 506 and are reversed. For example, compound switch and drivers 506 and are operated as directly driven devices and compound switch and drivers 502 and are operated as cascode devices. By dynamically changing the operating modes of embodiment compound switch and drivers 502 and 506 and during the various operational phases of switched-mode power converter 500, increased efficiency may be achieved due to reduced switching losses caused by the parasitic capacitances of the normally-off devices.

Figure 6:
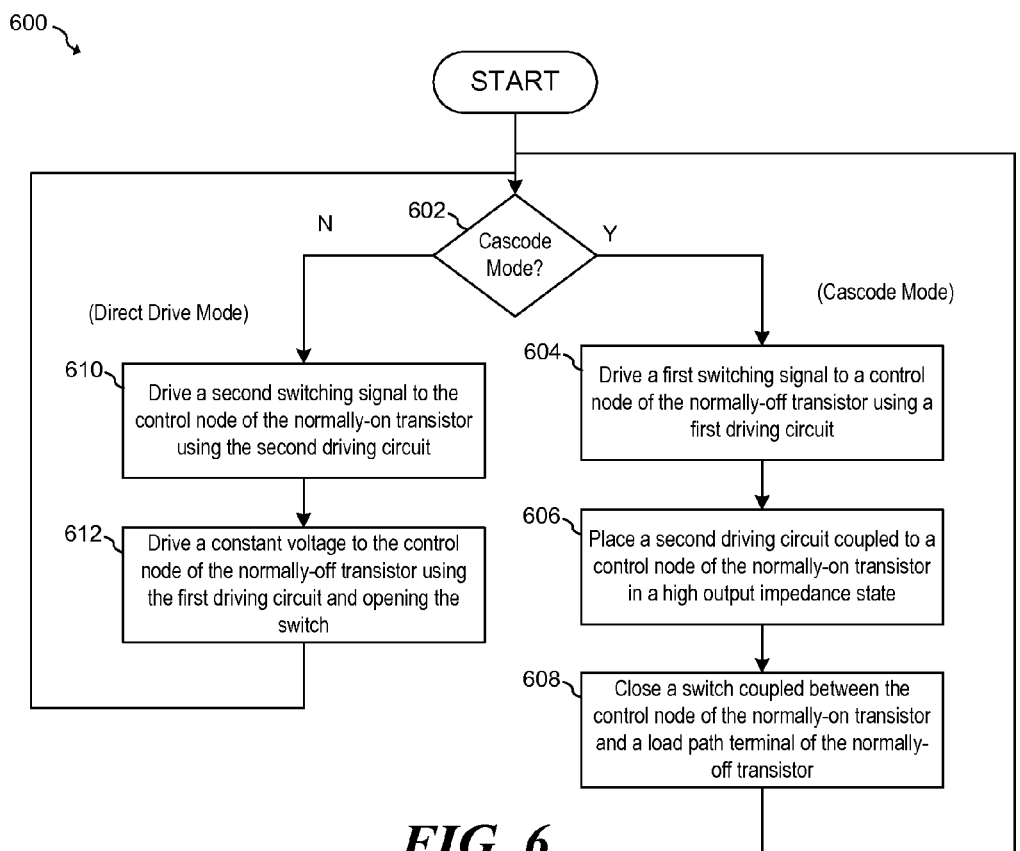
FIG. 6 illustrates a flow chart of an embodiment method.

FIG. 6 illustrates a flowchart of an embodiment method 600 of driving a compound switch that includes a normally-on transistor coupled in series with a normally-off transistor. This method may be used, for example, in conjunction with the embodiments of FIGS. 2a-c and 3. In an embodiment, a determination is made as to whether the compound switch is to operate in a cascode mode or a direct drive mode in step 602. This determination may be made, for example, based on a polarity of an input AC signal, as described in the embodiment of FIG. 4. If the cascode mode is selected, a first switching signal is coupled to a control node of a normally-off transistor using a first driving circuit in step 604. Concurrently in step 606, a second driving circuit is coupled to a control node of a normally-on transistor while its output is in a high-impedance state. A switch coupled between the control node of the normally-on transistor and the source terminal of the normally off transistor is closed in step 608.

If the direct drive mode is selected in step 602, s second switching signal is coupled to the control node of the normally-on transistor using the second driving circuit in step 610. In step 612, a constant voltage higher than the threshold voltage is coupled to the control node of the normally-off transistor using the first driving circuit. The switch coupled between the control node of the normally-on transistor and the source terminal of the normally-off transistor is opened.

Figure 7:
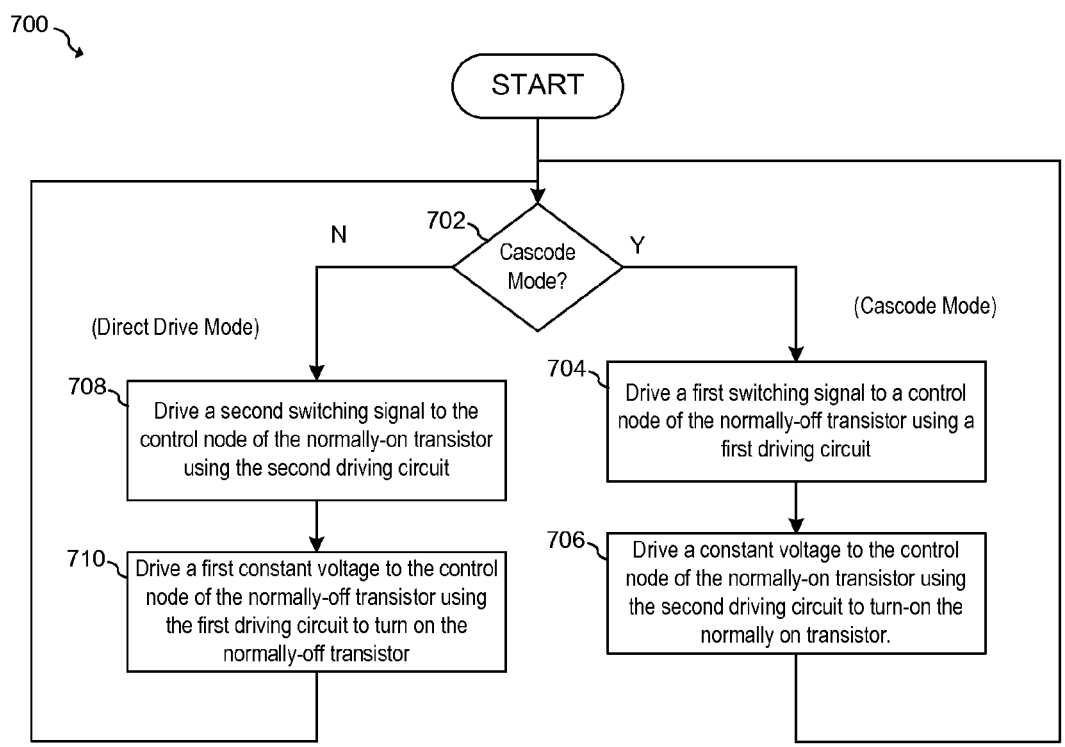
FIG. 7 illustrates a flow chart of a further embodiment method.

FIG. 7 illustrates a flowchart of an embodiment method 700 of driving a compound switch that includes a normally-on transistor coupled in series with a normally-off transistor. This method may be used, for example, in conjunction with the embodiments of FIGS. 4a-c. In an embodiment, a determination is made as to whether the compound switch is to operate in a cascode mode or a direct drive mode in step 702. This determination may be made, for example, based on a polarity of an input AC signal, as described in the embodiment of FIG. 4. If the cascode mode is selected, a first switching signal is coupled to a control node of a normally-off transistor using a first driving circuit in step 704. Concurrently in step 706, a second driving circuit is used to connect the control node of the normally-on transistor with the source node of the normally-off transistor.

If the direct drive mode is selected in step 702, a second switching signal is coupled to the control node of the normally-on transistor using the second driving circuit in step 708. In step 710, a constant voltage is coupled to the control node of the normally-off transistor using the first driving circuit.

In accordance with an embodiment, a circuit includes a first driver having a first output configured to be coupled to a control node of a normally-off transistor. The first driver is configured to drive a first switching signal at the first output in a cascode mode and configured to drive a first constant voltage at the first output in a direct drive mode. The circuit further includes a second driver having a second output configured to be coupled to a control node of a normally-on transistor that has a second load path terminal coupled to a first load path terminal of the normally-off transistor. The second driver is configured to drive a second switching signal at the second output in the direct drive mode.

In an embodiment, the second driver is further configured to high impedance at the second output in cascode mode, and the circuit further includes a switch coupled between the control node of the normally-on transistor and a second load path terminal of normally-off transistor, and the switch configured to be open in the direct drive mode and closed in the cascode mode. The first driver has a first a power supply terminal coupled between a first reference voltage node and the second load path terminal of the normally-off transistor, and the second driver comprises a second power supply terminal coupled between the second load path terminal of the normally-on transistor and a second reference voltage node.

In an embodiment, the first switching signal has a voltage that transitions between a voltage of the first reference voltage node and a voltage of the second load path terminal of the normally-off transistor, and the second switching signal comprises a voltage that transitions between a voltage of the second load path terminal of the normally-on transistor and the second reference voltage node.

The circuit may further include a first power supply coupled between the first reference voltage node and the second load path terminal of the normally-off transistor, and a second power supply coupled between the second load path terminal of the normally-on transistor and the second reference voltage node. The circuit may further include a controller configured to couple an input switching signal to an input of the first driver, assert a control signal that configures the second driver to have a high impedance at the second output, close the switch in the cascode mode, couple the input switching signal to an input of the second driver, apply a constant voltage to an input of the first driver, and open the switch in the direct drive mode. In some embodiments, the constant voltage includes a turn-on voltage of the normally-off transistor.

According to some embodiments, the circuit further includes the normally-on transistor and the normally-off transistor. The normally-on transistor may include, for example, a GaN HEMT device and the second load path terminal of the normally-on transistor comprises a source of the GaN HEMT. In an embodiment, the normally-off transistor is an enhancement mode MOSFET transistor, the first load path terminal of the enhancement mode MOSFET transistor is a drain of the enhancement mode MOSFET transistor and the second load path terminal of the enhancement mode MOSFET transistor is a source of the enhancement mode MOSFET transistor.

In an embodiment, the first driver includes first power supply terminals coupled between a first reference voltage node and the second load path terminal of the normally-off transistor, and the second driver includes second power supply terminals coupled between the second load path terminal of the normally-off transistor and a second reference voltage node.

A method of operating a switch having a normally-on transistor coupled in series with a normally-off transistor includes, in a cascode mode, driving a first switching signal to a control node of the normally-off transistor using a first driving circuit, and turning on the normally-on transistor having a control node coupled to an output of a second driving circuit. The method further includes, in a direct drive mode, driving a second switching signal to the control node of the normally-on transistor using the second driving circuit, and driving a first constant voltage to the control node of the normally-off transistor using the first driving circuit and opening the switch.

The method may further include, in the cascode mode, placing a second driving circuit coupled to the control node of the normally-on transistor in a high output impedance state, and closing a switch coupled between the control node of the normally-on transistor and a load path terminal of the normally-off transistor. The normally-off transistor may be implemented using a FET transistor and the load path terminal of the normally-off transistor may include a source of the normally-off transistor.

In the cascode mode, the switch may couple the control node of the normally-on transistor to a source terminal of the normally-off transistor. The normally-off transistor may be implemented using an enhancement mode MOSFET and the normally-on transistor may be implemented using a GaN HEMT.

In an embodiment, the method further includes applying a first supply voltage between power supply terminals of the first driving circuit, and applying a second supply voltage between power supply terminals of the second driving circuit. Applying the first supply voltage may include applying a first power supply reference node to a positive supply terminal of the first driving circuit and coupling a load terminal of the normally-off transistor to a negative supply terminal of the first driving circuit. Applying the second supply voltage may include applying a second power supply reference node to a negative supply terminal of the second driving circuit and coupling a load terminal of the normally-on transistor to a positive supply terminal of the second driving circuit.

In accordance with a further embodiment, a switched-mode power supply includes a plurality of compound switching circuits that includes a first compound switching circuit coupled in series with a second compound switching circuit to form a first series combination. Each of the plurality of compound switching circuits includes a normally-on transistor, a normally-off transistor having a first load path terminal coupled to a second load path terminal of the normally-on transistor, and a first driver comprising a first output coupled to a control node of the normally-off transistor. The first driver configured to drive a first switching signal at the first output in a cascode mode and configured to drive a first constant voltage at the first output in a direct drive mode. Each of the plurality of compound switching circuits further includes a second driver having a second output coupled to a control node of the normally-on transistor. The second driver is configured to drive a second switching signal at the second output in the direct drive mode, and each of the plurality of compound switching circuits is configured to connect the control node of the normally-on transistor with a source of the normally-off transistor in the cascode mode.

In an embodiment, the second driver is further configured to have a high impedance at the second output in the cascode mode, and each of the plurality of compound switching circuits further comprises a switch coupled between the control node of the normally-on transistor and a second load path terminal of normally-off transistor. The switch is configured to be open in the direct drive mode and closed in the cascode mode.

Advantages of embodiments include the reduction of switching losses and losses due to the voltage drop of reversed-biased normally-on transistors. A further advantage of embodiments includes the ability to operate a normally-on device coupled in series with a normally-off device without overstressing the normally-off device. Accordingly, the normally-off device may be sized and configured in a manner to reduce switching losses.

Further advantages of embodiments include optimization possibilities for different applications by choosing the best suited combination of operating modes.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For example, embodiment power supply systems and other embodiment driver systems may be implemented using stacked driver circuit disclosed in co-pending application Ser. No. 14/473,101.

What is claimed is:

1. A circuit comprising:
a first driver comprising a first output configured to be coupled to a control node of a normally-off transistor, the first driver configured to drive a first switching signal at the first output in a cascode mode and configured to drive a first constant voltage at the first output in a direct drive mode, wherein the normally-off transistor has a first load path between a first load path terminal of the normally-off transistor and a second load path terminal of the normally-off transistor; and
a second driver comprising a second output configured to be coupled to a control node of a normally-on transistor, the second driver configured to drive a second switching signal at the second output in the direct drive mode and configured to drive a static signal at the second output in the cascode mode, wherein the normally-on transistor has a second load path between a third load path terminal of the normally-on transistor and a fourth load path terminal of the normally-on transistor, the second load path terminal of the normally-off transistor is coupled to the third load path terminal of the normally-on transistor.

2. The circuit of claim 1, wherein:
the second driver is further configured to high impedance at the second output in cascode mode; and
the circuit further comprises a switch coupled between the control node of the normally-on transistor and the first load path terminal of the normally-off transistor, the switch configured to be open in the direct drive mode and closed in the cascode mode.

3. The circuit of claim 1, wherein:
the first driver comprises a first power supply terminal of the first driver and a second power supply terminal of the first driver configured to be coupled to the first load path terminal of the normally-off transistor; and
the second driver comprises a third power supply terminal of the second driver, and a fourth power supply terminal of the second driver configured to be coupled to the third load path terminal of the normally-on transistor.

4. The circuit of claim 3, wherein:
the first switching signal comprises a voltage that transitions between a voltage of the first power supply terminal of the first driver and a voltage of the first load path terminal of the normally-off transistor; and
the second switching signal comprises a voltage that transitions between a voltage of the third load path terminal of the normally-on transistor and the third power supply terminal of the second driver.

5. The circuit of claim 3, further comprising:
a first power supply coupled between the first power supply terminal of the first driver and the second power supply terminal of the first driver; and a second power supply coupled between the third power supply terminal of the second driver and the fourth power supply terminal of the second driver.

6. The circuit of claim 1, further comprising the normally-on transistor and the normally-off transistor.

7. The circuit of claim 6, wherein the normally-on transistor comprises a GaN HEMT device and the third load path terminal of the normally-on transistor comprises a source of the GaN HEMT device.

8. The circuit of claim 7, wherein the normally-off transistor comprises an enhancement mode MOSFET transistor, the second load path terminal of the enhancement mode MOSFET transistor comprises a drain of the enhancement mode MOSFET transistor and the first load path terminal of the enhancement mode MOSFET transistor comprises a source of the enhancement mode MOSFET transistor.

9. A circuit comprising:
a first driver comprising a first output configured to be coupled to a control node of a normally-off transistor, the first driver configured to drive a first switching signal at the first output in a cascode mode and configured to drive a first constant voltage at the first output in a direct drive mode, wherein the normally-off transistor has a first load path between a first load path terminal of the normally-off transistor and a second load path terminal of the normally-off transistor;
a second driver comprising a second output configured to be coupled to a control node of a normally-on transistor, the second driver configured to drive a second switching signal at the second output in the direct drive mode, wherein the normally-on transistor has a second load path between a third load path terminal of the normally-on transistor and a fourth load path terminal of the normally-on transistor, the second load path terminal of the normally-off transistor is coupled to the third load path terminal of the normally-on transistor, and
a controller configured to
couple an input switching signal to an input of the first driver, assert a control signal that configures the second driver to have a high impedance at the second output, and close the switch in the cascode mode, and
couple the input switching signal to an input of the second driver, apply a constant voltage to an input of the first driver, and open the switch in the direct drive mode.

10. The circuit of claim 9, wherein the constant voltage comprises a turn-on voltage of the normally-off transistor.

11. A method of operating a switch comprising a normally-on transistor coupled in series with a normally-off transistor, the method comprising: in a cascode mode, driving a first switching signal to a control node of the normally-off transistor using a first driving circuit, and persistently turning on the normally-on transistor having a control node coupled to an output of a second driving circuit, wherein the persistently turning on the normally-on transistor comprises applying a static signal to the control node of the normally-on transistor; and in a direct drive mode, driving a second switching signal to the control node of the normally-on transistor using the second driving circuit, and driving a first constant voltage to the control node of the normally-off transistor using the first driving circuit and opening the switch.

12. The method of claim 11, further comprising:
in the cascode mode, placing a second driving circuit coupled to the control node of the normally-on transistor in a high output impedance state, and closing a switch coupled between the control node of the normally-on transistor and a load path terminal of the normally-off transistor.

13. The method of claim 12, wherein the normally-on transistor and the normally-off transistor each comprises a FET transistor and the load path terminal of the normally-off transistor comprises a source of the normally-off transistor.

14. The method of claim 11, wherein, in the cascode mode, the switch couples the control node of the normally-on transistor to a source terminal of the normally-off transistor.

15. The method of claim 11, wherein the normally-off transistor comprises an enhancement mode MOSFET and the normally-on transistor comprises a GaN HEMT.

16. The method of claim 11, further comprising applying a first supply voltage between power supply terminals of the first driving circuit, and applying a second supply voltage between power supply terminals of the second driving circuit.

17. The method of claim 16, wherein applying the first supply voltage comprises applying a first power supply reference node to a positive supply terminal of the first driving circuit and coupling a load terminal of the normally-off transistor to a negative supply terminal of the first driving circuit.

18. The method of claim 16, wherein applying the second supply voltage comprises applying a second power supply reference node to a negative supply terminal of the second driving circuit and coupling a load terminal of the normally-on transistor to a positive supply terminal of the second driving circuit.

19. A switched-mode power supply comprising:
a plurality of compound switching circuits, wherein the plurality of compound switching circuit includes a first compound switching circuit coupled in series with a second compound switching circuit to form a first series combination, and each of the plurality of compound switching circuits comprises:
a normally-on transistor,
a normally-off transistor having a first load path terminal coupled to a second load path terminal of the normally-on transistor,
a first driver comprising a first output coupled to a control node of the normally-off transistor, the first driver configured to drive a first switching signal at the first output in a cascode mode and configured to drive a first constant voltage at the first output in a direct drive mode, and
a second driver comprising a second output coupled to a control node of the normally-on transistor, the second driver configured to drive a second switching signal at the second output in the direct drive mode, and configured to drive a static signal at the second output in the cascode mode, wherein each of the plurality of compound switching circuits is configured to connect the control node of the normally-on transistor with a source of the normally-off transistor in the cascode mode.

20. The switched-mode power supply of claim 19, wherein:
the second driver is further configured to have a high impedance at the second output in the cascode mode; and
each of the plurality of compound switching circuits further comprises a switch coupled between the control node of the normally-on transistor and a second load path terminal of normally-off transistor, the switch configured to be open in the direct drive mode and closed in the cascode mode.

21. The switched-mode power supply of claim 19, further comprising a polarity sensor coupled to an input terminal of the switched-mode power supply, wherein the switched-mode power supply is configured to change between direct drive mode and cascode mode depending on a polarity of a signal coupled to the input terminal of the switched-mode power supply.

* * * * *